US 7,667,244 B2

(12) United States Patent
Narita (10) Patent No.: US 7,667,244 B2
(45) Date of Patent: Feb. 23, 2010

(54) SEMICONDUCTOR DEVICE (75) Inventor: Tadashi Narita, Miyagi (JP)

(73) Assignee: Oki Semiconductor Co., Ltd., Tokyo (JP)

(*) Notice: Subject to any disclaimer, the term of this patent is extended or adjusted under 35 U.S.C. 154(b) by 17 days.

(21) Appl. No.: 12/149,567

(22) Filed: May 5, 2008

(65) Prior Publication Data

US 2008/0303100 A1    Dec. 11, 2008

(30) Foreign Application Priority Data

Jun. 5, 2007  (JP)  .............................. 2007-149167

(51) Int. Cl.
 *H01L 27/10* (2006.01)
(52) U.S. Cl. ...................... 257/206; 257/351
(58) Field of Classification Search .................. 257/69, 257/195, 204, 206, 338, 350, 351, 357, 369, 257/371

See application file for complete search history.

(56) References Cited

U.S. PATENT DOCUMENTS 6,015,996 A * 1/2000 Lee ............................ 257/393

FOREIGN PATENT DOCUMENTS

JP          8-288398       11/1996
JP        2001-077210       3/2001

* cited by examiner

*Primary Examiner*—Thien F Tran
(74) *Attorney, Agent, or Firm*—Rabin & Berdo, PC (57) ABSTRACT

On a semiconductor substrate, a gate electrode is disposed obliquely across the boundary between an N-type region and a P-type region, and thereby an effective gate width of a region, in which the boundary between the N-type region and the P-type region intersects with the gate electrode, is wider than that of the gate electrode. Accordingly, the occurrence of abnormal resistance, which makes it difficult for an electric current to flow in the gate electrode on the boundary between the N-type region and the P-type region, may be effectively suppressed without physically widening the gate width. Moreover, widening of the gate width of the gate electrode may be eliminated in suppressing the occurrence of abnormal resistance and it is not necessary to enlarge the areas of the N-type region and the P-type region, thereby inevitable enlargement of the overall size of the semiconductor device being avoided.

13 Claims, 6 Drawing Sheets

SEMICONDUCTOR DEVICE

CROSS-REFERENCE TO RELATED APPLICATION

This application claims priority under 35 USC 119 from Japanese Patent Application No. 2007-149167, the disclosure of which is incorporated by reference herein.

BACKGROUND OF THE INVENTION

1. Field of the Invention

The present invention relates to a semiconductor device having a dual-gate structure.

2. Description of Related Art

As in recent years, electronic devices have become lighter in weight and smaller in size, as well as higher in performance, it is called on to develop smaller-size and higher-performance semiconductors for use in these electronic devices.

Figure 6A:
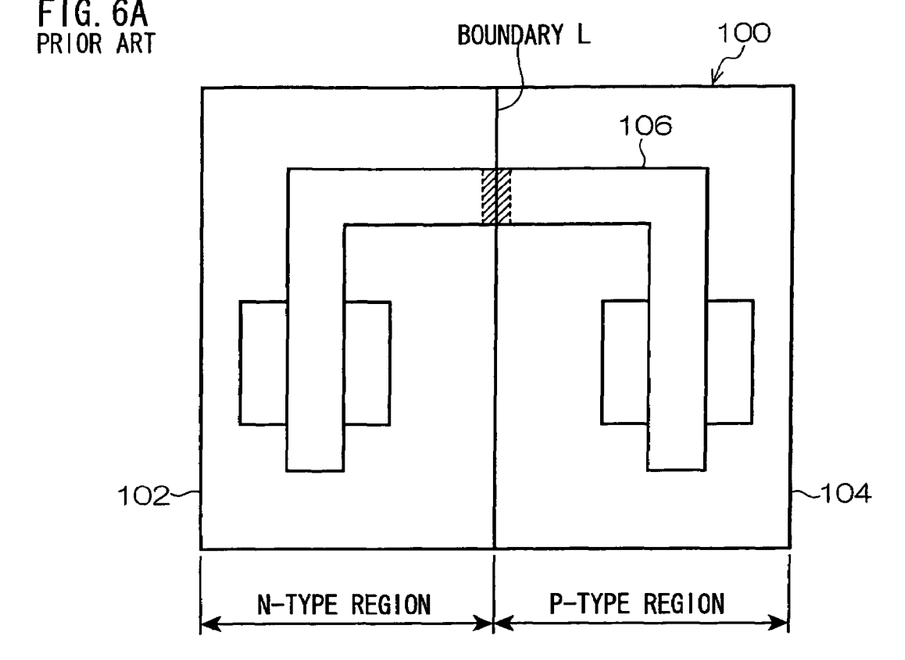
FIG. 6A is a plan view showing a semiconductor device according to another prior art.

For a dual-gate structured semiconductor device 100 having a gate electrode composed of a N-type conductive layer and a P-type conductive layer as shown in FIG. 6A to address such a need for miniaturization, it is necessary to narrow the gate width of a gate electrode 106 straddling (extending across) a N-type transistor formation region 102 and a P-type transistor formation region 104 to reduce an layout area (defined by the areas of the N-type transistor formation region 102 and of the P-type transistor formation region 104).

When the gate width of the gate electrode 106 is narrowed, however, a metal silicide layer deposited on the gate electrode 106, may peel off or agglutinate locally (in the proximity of the boundary L between the N-type transistor formation region 102 and the P-type transistor formation region 104), causing a defective portion to be formed therein. For this reason, a problem has risen that abnormally-high electric resistance occurs in the gate electrode 106.

Figure 6B:
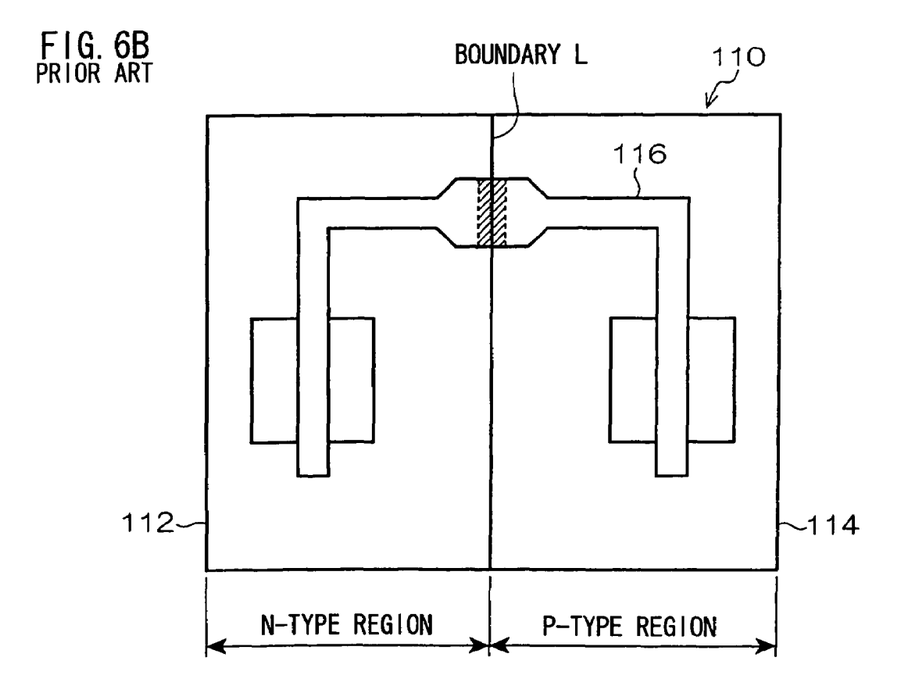
FIG. 6B is a plan view showing a semiconductor device according to still another prior art.

To resolve this problem, a semiconductor device 110 having a planar structure (the disclosure of which is incorporated by reference herein) as shown in FIG. 6B has been proposed.

A gate electrode 116 of the semiconductor device 110 (the disclosure of which is incorporated by reference herein) is structured so that it has a gate width widened in the proximity of the boundary L between an N-type transistor formation region 112 and a P-type transistor formation region 114. In this way, the gate width of the gate electrode 116 may be widen without widening the overall gate width of the gate electrode 116 to prevent the metal silicide layer deposited on the gate electrode 116 from peeling off or agglutinating, successfully suppressing the formation of a defective portion therein.

Since the layout area, however, is substantially determined by the gate width of the gate electrode 116 in the proximity of the boundary, widening the gate width of the gate electrode 116 in the proximity of the boundary L involves the enlargement of the layout area, inevitably leading to the larger-size semiconductor device 110.

SUMMARY OF THE INVENTION

The object of the present invention is to provide a semiconductor device, in which a metal silicide layer may be prevented from peeling off or agglutinating.

A semiconductor device according to a first aspect of the present invention includes:

a semiconductor substrate having an N-channel transistor formation region and a P-channel transistor formation region disposed adjacent to the N-channel transistor formation region; and a P-channel transistor formation region formed on the semiconductor substrate and disposed adjacent to the N-channel transistor formation region; and a gate electrode straddling the N-channel transistor formation region and the P-channel transistor formation region, wherein the gate electrode is disposed obliquely across a boundary between the N-channel transistor formation region and the P-channel transistor formation region.

According to the first aspect of the present invention, the semiconductor device includes an N-type transistor formation region and a P-type transistor formation region formed on a semiconductor substrate. On the semiconductor substrate, a gate electrode is disposed so as to straddle the N-type transistor formation region and the P-type transistor formation region, forming a dual-gate structure. The gate electrode is disposed obliquely across the boundary between the N-type transistor formation region and the P-type transistor formation region.

In this way, the width of a region, in which the boundary between the N-type transistor formation region and the P-type transistor formation region intersects with the gate electrode, is wider than the gate width of the gate electrode. Specifically, according to the first aspect of the present invention, the gate electrode may be structured so that the width of the region, in which the boundary between the N-type transistor formation region and the P-type transistor formation region intersects with the gate electrode, namely an effective gate width, is wider than the gate width of the gate electrode straddling orthogonally the boundary between the N-type transistor formation region and the P-type transistor formation region.

Thus, abnormal resistance, which makes it difficult for an electric current to flow in the gate electrode on the boundary between the N-type transistor formation region and the P-type transistor formation region, may be prevented from occurring without physically widening the gate width of the gate electrode. Moreover, a problem of widening of the gate width of the gate electrode may be addressed, to some extent, in preventing abnormal resistance from occurring, thereby the enlargement of the area defined by the N-type transistor formation region and the P-type transistor formation region being successfully suppressed. This may address, to some extent, a problem of enlargement of the overall size of the N-type transistor.

In the semiconductor device according to a second aspect of the present invention, the gate electrode may be disposed across the boundary between the P-channel transistor formation region and the N-channel transistor formation region at an angle of 45 degrees.

According to the second aspect of the present invention, the overall size of the semiconductor device may be suitably miniaturized by adjusting the width of the region, in which the boundary between the N-type transistor formation region and the P-type transistor formation region intersects with the gate electrode to suppress the occurrence of abnormal resistance in the gate electrode, for example, which is disposed at an angle of 45 degrees (measured clockwise relative to the boundary) relative to the boundary between the N-type transistor formation region and the P-type transistor formation region.

In the semiconductor device according to a third aspect of the present invention, the gate electrode may include a metal silicide layer deposited on a conductive layer.

In the semiconductor device according to a fourth aspect of the present invention, the conductive layer of the gate electrode formed in the N-channel transistor formation region may be an N-type conductive layer and the conductive layer of the gate electrode formed in the P-channel transistor formation region may be a P-type conductive layer.

In the semiconductor device according to a fifth aspect of the present invention, the conductive layer may be made of a silicon layer.

In the semiconductor device according to a sixth aspect of the present invention, the N-channel transistor formation region may comprise a plurality of first active regions and the P-channel transistor formation region may comprise a plurality of second active regions, each of the first active regions and each of the second active regions being displaced from each other.

According to any of the aforementioned aspects of the present invention, the metal silicide layer may be prevented from peeling off or agglutinating without widening the gate width of the gate electrode.

BRIEF DESCRIPTION OF THE DRAWINGS

Preferred exemplary embodiments of the present invention will be described in detail based on the following figures, wherein.

DETAILED DESCRIPTION OF THE INVENTION

Hereinafter, a semiconductor device 10 of the present invention is described.

Figure 1A:
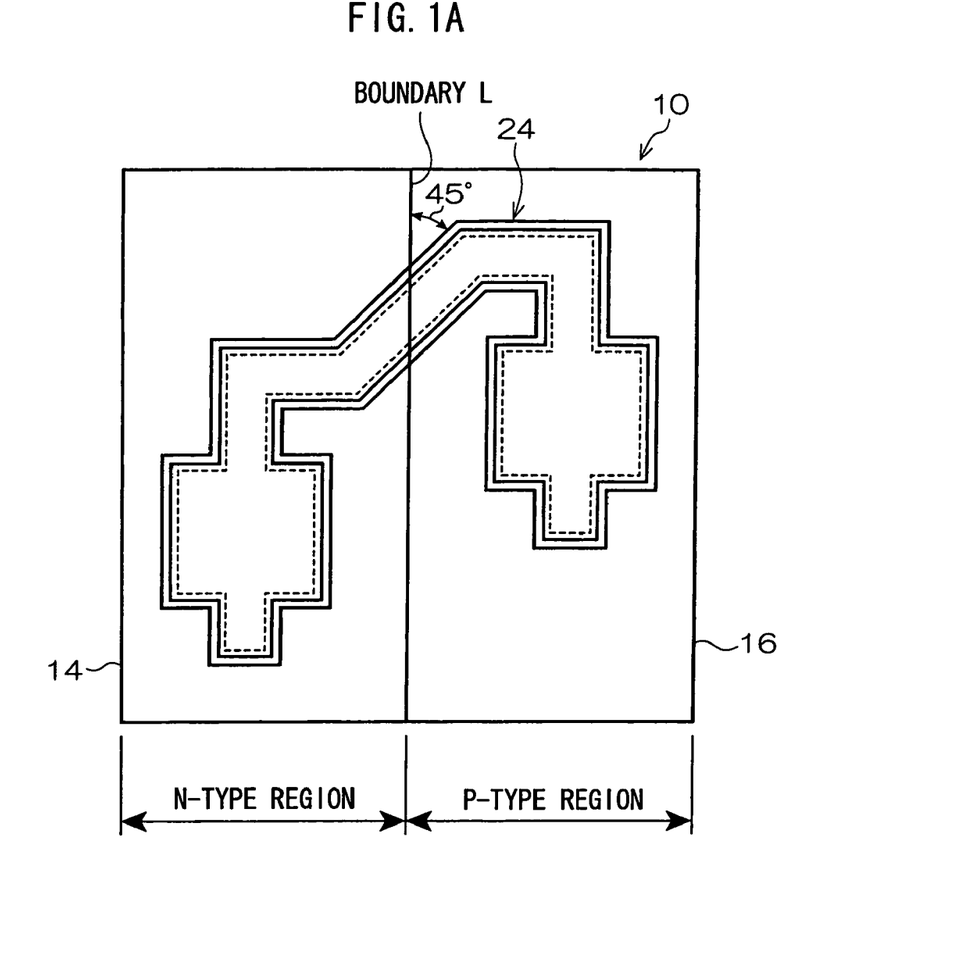
FIG. 1A is a plan view showing a semiconductor device according to an embodiment of the present invention.
Figure 1B:
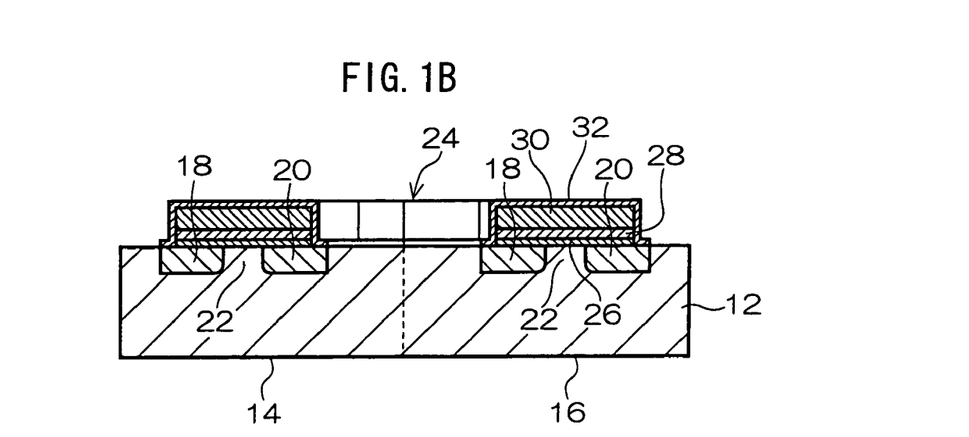
FIG. 1B is a side sectional view showing the semiconductor device according to the embodiment of the present invention.

As shown in FIGS. 1A and 1B, the semiconductor device 10 includes a semiconductor substrate 12 with an N-channel transistor formation region (hereinafter, simply referred to as an N-type region) 14 in one region thereof and a P-channel transistor formation region (hereinafter, simply referred to as an N-type region) 16 in the other region thereof. It should be noted that in the example of the present invention, herein, the N-channel transistor formation region 14 is formed on any one of P-type substrates such as a P well (or a P-type semiconductor substrate), which is a first conductive impurity region, and the P-channel transistor formation region 16 is formed on any one of N-type substrates such as a N well (or a N-type semiconductor substrate), which is a second conductive impurity region.

The N-type region 14 and the P-type region 16 include a source diffusion layer 18, which is a first diffusion layer, and a drain diffusion layer 20, which is a second diffusion layer, formed thereon, respectively, between which a channel region 22 lies. The diffusion layer in the N-type region 14 is formed by injecting an N-type impurity therein, and the diffusion layer in the P-type region 16 is formed by injecting a P-type impurity therein. It should be noted that in the accompanying drawings, identical symbols are used to represent the source and drain diffusion layers in both of the N-type region 14 and the P-type region 16, regardless of conductive type thereof, for convenience of explanation.

In the channel region 22 of the semiconductor substrate 12, a gate electrode 24 is disposed so as to control an electric current flowing into the channel region 22.

The gate electrode 24 is disposed on a gate oxide film 26, which is an insulating film deposited on the semiconductor substrate 12, and is composed of a polysilicon layer 28, which is a conductive layer laminated on the gate oxide film 26, and a metal silicide layer 30 further laminated on the polysilicon layer 28. The insulating film 32 made of any one of materials such as SiN, SiON, and $SiO_2$ is formed so as to encapsulate the gate oxide film 26, the polysilicon 28, and the metal silicide layer 30. The metal silicide layer 30 also extends over the source diffusion layer 18 and the drain diffusion layer 20.

The gate electrode 24 extends seamlessly over the channel region 22 in the N-type region 14 and the channel region 22 in the P-type region 16 so as to across the boundary L between the N-type region 14 and the P-type region 16.

Thus, the gate electrode 24 is common to both of a N-channel MOS transistor, which is composed of the source diffusion layer 18 and the drain diffusion layer 20 deposited in the N-type region 14, and the gate electrode 24 in the a channel region 22 lying between the source diffusion layer 18 and the drain diffusion layer 20, and a P-channel MOS transistor, which is composed of the source diffusion layer 18 and the drain diffusion layer 20 deposited in the P-type region 16, and the gate electrode 24 in the channel region 22 lying between the source diffusion layer 18 and the drain diffusion layer 20. The conductive layer (the polysilicon layer 28) of the gate electrode 24 in the N-type region 14 is an N-type conductive layer with an N-type impurity doped, and the conductive layer (the polysilicon layer 28) of the gate electrode 24 in the P-type region 16 is a P-type conductive layer with a P-type impurity doped. The boundary L between the N-type region 14 and the P-type region 16, and the conductive layer of the gate electrode in the proximity thereof are in an intrinsic state when the P-type and N-type impurities mutually diffused, inducing high resistance. In this way, the dual-gate CMOS transistor is fabricated.

Examples of the metal silicide layer 30 include, but are not limited to, a titanium silicide layer, a cobalt silicide layer, and a nickel silicide layer.

In this embodiment, the gate electrode 24 is disposed obliquely across the boundary L between the N-type region 14 and the P-type region 16 at an angle of 45 degrees clockwise relative to the boundary L as shown in FIG. 1.

Figure 2:
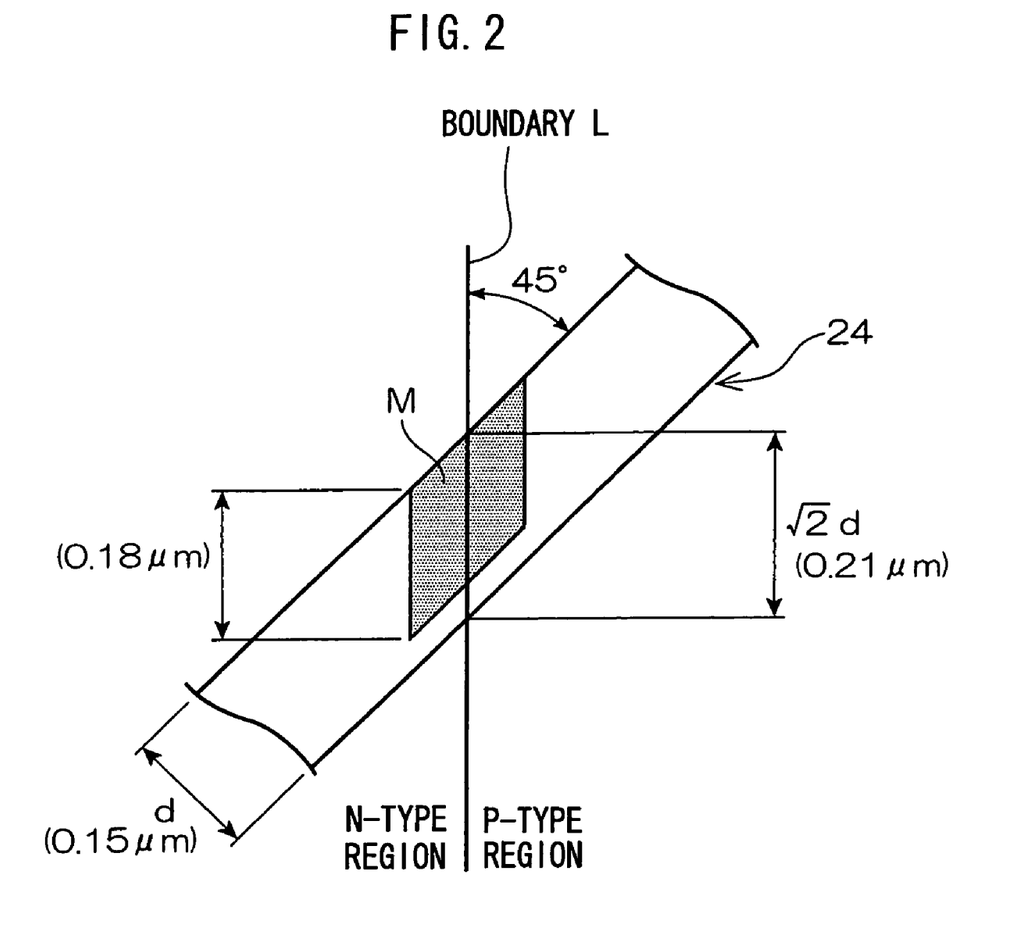
FIG. 2 is a plan view showing part of the gate electrode of the semiconductor device according to the embodiment of the present invention.

Accordingly, as shown in FIG. 2, assuming that the width of the gate electrode 24 (occasionally, simply referred to as the gate width) is d, the region width (an effective gate width with respect to a N-P interference part) of the region (the N-P interference zone), in which the boundary L between the N-type region 14 and the P-type region 16 intersects with the gate electrode 24, is (the square root of 2)*d. This boundary L indicates the boundary region lying between the N-type region and the P-type region (the boundary between the P-type substrate and the N-type substrate) or the zone in the proximity thereof.

In this way, as shown in FIG. 6A, according to this embodiment of the present invention, the effective gate width with respect to the N-P interference zone of the gate electrode 24 may be approximately 1.4 times larger than the gate width of a gate electrode 106 disposed orthogonally across the boundary between a N-type transistor formation region 102 and a P-type transistor formation region 104.

Figure 3:
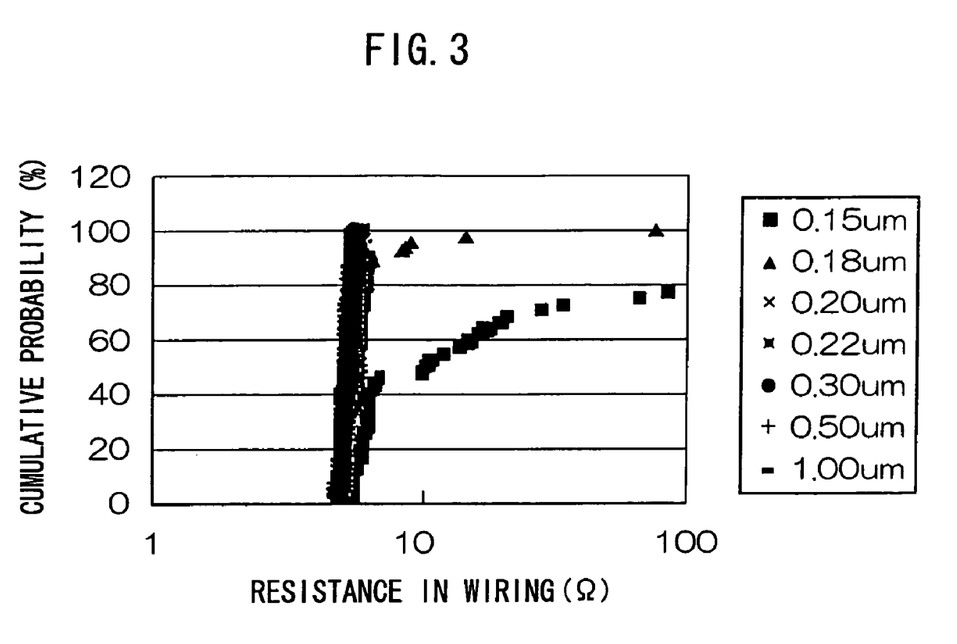
FIG. 3 is a plot showing the relationship, in terms of cumulative probability, between the resistance values for the gate electrode and the sizes of the gate width of the gate electrode, the gate electrode being contained in the semiconductor device according to the embodiment of the present invention.

FIG. 3 is a plot showing the relationship, in terms of cumulative probability, between the resistance values and the sizes of the gate width of the gate electrode 24. As known from the plot shown in FIG. 3, when the gate width of the gate electrode 24 is smaller than 0.18 μm, abnormal resistance occurs in the gate electrode 24. This suggests that with the gate width of 0.18 μm or larger, abnormal resistance may be effectively prevented from occurring in the gate electrode 24.

The metal silicide layer 30 may peel off or agglutinate along the side wall of the gate electrode 24 in a process of forming the insulating film 32 so as to surround the metal silicide layer 30 (see FIG. 1B), or due to stress exerted in a subsequent process of thermal history. Peeling off or agglutination may occur in a region M of the metal silicide layer 30 as shown in FIG. 2, and the vertical dimension of the region M (a dimension measured parallel to the boundary L between the N-type region 14 and the P-type region 16) is 0.18 μm, almost equivalent to the gate width of the gate electrode, in which abnormal resistance may occur.

In this embodiment, to address a problem of miniaturization of the semiconductor device 10, not only the gate electrode 24 is disposed obliquely across the boundary L between the N-type region 14 and the P-type region 16, but also the gate width (d) of the gate electrode 24 is defined to be 0.18 μm. Since the effective width of the gate electrode 24 is 0.25 μm ((the square root of 2)*d), pealing off or agglutination may be prevented from occurring over the entire region of the gate electrode 24, successfully suppressing the occurrence of abnormal resistance in the gate electrode 24.

Thus, the effective gate width may be widen without widening the gate width of the gate electrode 24, and thereby the occurrence of abnormal resistance, which makes it difficult for an electric current to flow in the gate electrode 24 on the boundary L between the N-type region 14 and the P-type region 16, is suppressed. In this case, a problem of widening of the gate width of the gate electrode 24 may be addressed, to some extent, in suppressing the occurrence of abnormal resistance, it is not necessary to enlarge the area defined by the N-type transistor formation region and the P-type transistor formation region. This addresses, to some extent, a problem of enlargement of the overall size of the N-type transistor.

It should be noted that in this embodiment, the gate electrode 24 is disposed at an angle of 45 degrees clockwise relative to the boundary L between the N-type region 14 and the P-type region 16 as shown in the figure. The gate electrode 24, however, may be not always disposed at an angle of 45 degrees relative to the boundary L provided that it is disposed obliquely across the boundary L. On the other hand, if the angle, at which the gate electrode 24 is inclined relative to the boundary L, is larger than 45 degrees, it is necessary to widen the gate width of the gate electrode 24 in proportion to the angle to avoid the occurrence of abnormal resistance in the gate electrode 24. While, if the angle, at which the gate electrode 24 is inclined relative to the boundary L, is smaller than 45 degrees, the gate electrode 24 should be lengthened along the boundary L, occasionally involving the enlargement of the N-type region 14 and the P-type region 16 in terms of layout.

In the light of the aforementioned considerations, it is preferable to define the degree, at which the gate electrode 24 is inclined relative to the boundary L between the N-type region 14 and the P-type region 16, to be 45 degrees from the viewpoints of the miniaturization of the semiconductor 10 and the suppression of the occurrence of abnormal resistance in the gate electrode 24.

When the gate electrode 24 is inclined at an angle almost identical to 45 degrees, namely when the actually formed gate electrode intersects with the boundary L at an angle of 45 degrees±5 degrees (in the range of 40 to 50 degrees), the aforementioned problem may be addressed, considering that a displacement in mask causes a shift in angle, at which the gate electrode 24 intersects with the boundary L. Alternatively, the angle, at which the gate electrode 24 intersects with the boundary L, may be larger than 45 degrees within such a permissible extent that the gate width may be widened in terms of layout, or it may be smaller than 45 degrees without enlarging the N-type region and the P-type region in terms of layout, if at all possible.

Figure 4:
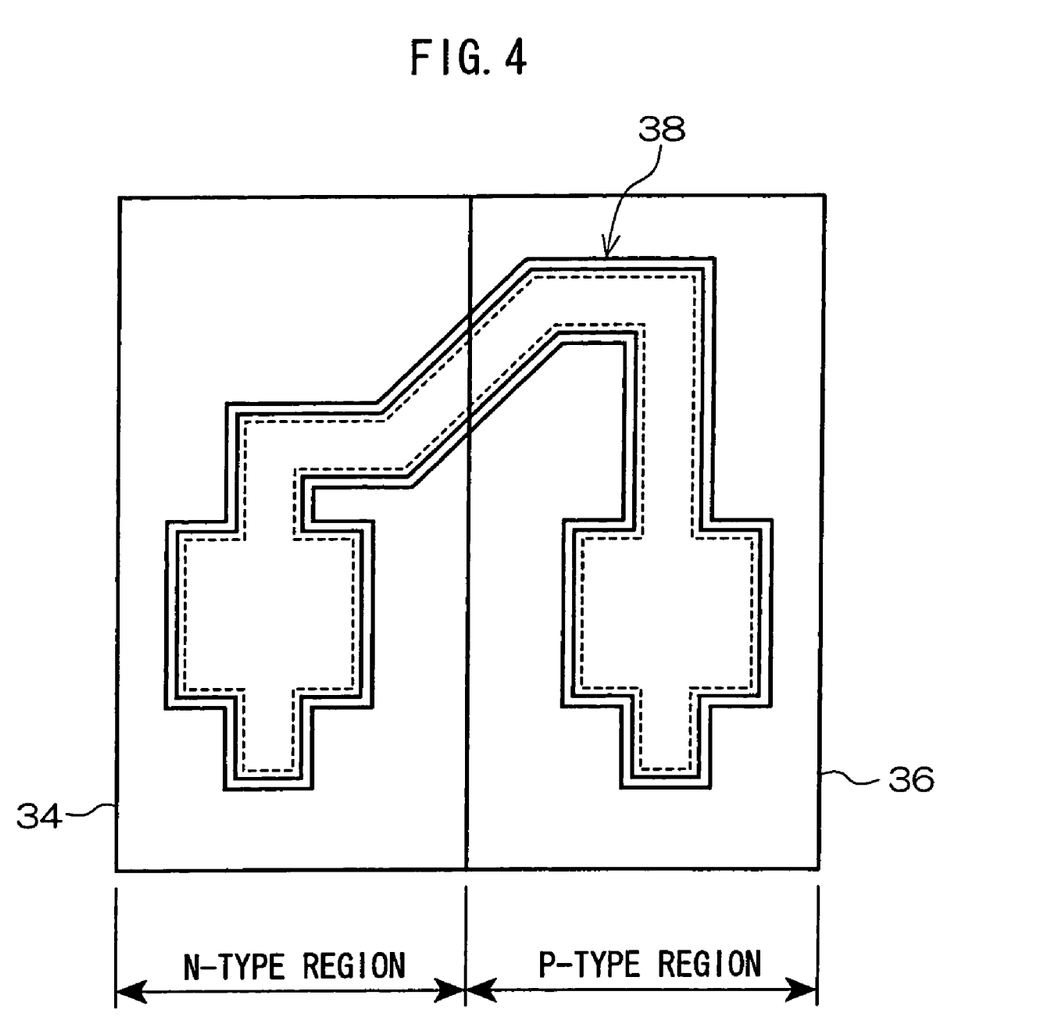
FIG. 4 is a plan view showing the semiconductor device according to another embodiment of the present invention.

As shown in FIG. 1A, in this embodiment of the present invention, the gate electrode is configured so as to have an identical length in the N-type region and in the P-type region. Alternatively, as shown in FIG. 4, the source and drain diffusion layers in a N-type region 34 and the source and drain diffusion layers in the P-type region 36 may be disposed on a line parallel to a semiconductor substrate 12 to construct a gate electrode 38 having different-lengths in a N-type region 34 and in a P-type region 36.

In such a configuration of the gate electrode 38, the diffusion layers are disposed side by side each other in the N-type region 34 and the P-type region 36. Therefore, for example, by forming contact holes through an interlayer insulating layer covering the gate electrode 38, the N-type region 34, and the P-type region 36, it is not necessary to obliquely dispose the gate electrode, to some degree, in wiring the transistors in the N-type region 14 and the P-type region 16 through these contact holes to electrically connect with each other, or in doing the layout of wiring so as to traverse these two transistors.

Figure 5A:
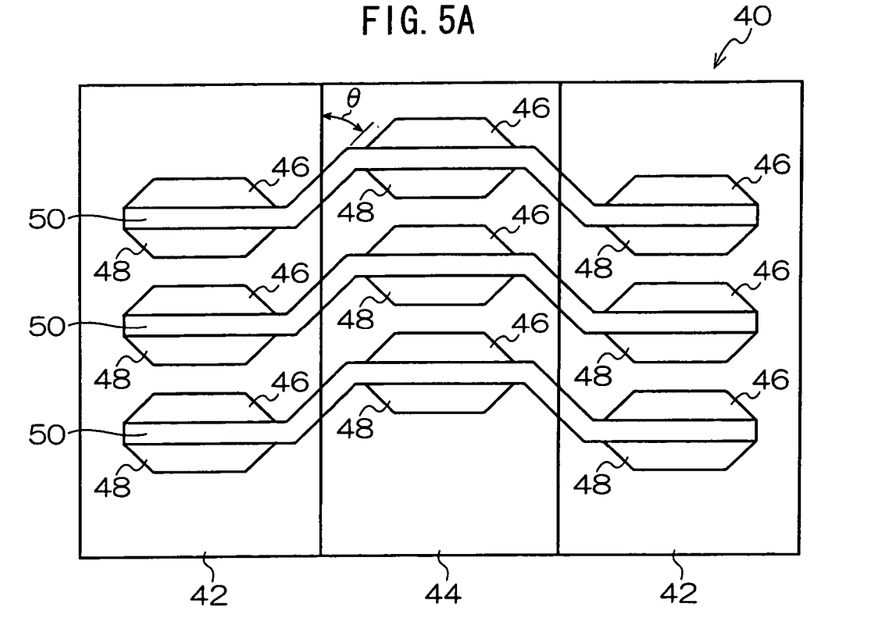
FIG. 5A is a plan view showing the semiconductor device according to still another embodiment of the present invention.

As shown in FIG. 1A, the configuration, in which the gate electrode 24 is disposed obliquely relative to the boundary L between the N-type region 14 and the P-type region 16, is also useful in a MOS semiconductor device 40 as shown in FIG. 5A.

Now, the MOS semiconductor device 40 shown in FIG. 5A is in brief described below.

This MOS semiconductor device 40 is composed of two N-channel MOS transistor formation regions 42, each of which includes plural N-type transistors formed therein, and a P-channel MOS transistor formation region 44 lying therebetween, which includes plural P-type MOS transistors formed. Each of the N-type MOS transistors and P-type MOS transistors formed in active regions of the N-channel MOS transistor formation regions 42 and of the P-type MOS transistor formation region 44, respectively, has an octagonal active region (an area defined by a source diffusion layer 46, a drain diffusion layer 48, and a gate electrode 50 formed on a channel region lying therebetween).

For example, to reduce the region, which includes many transistors formed, it has been taken into account that the octagonal regions are displaced each other (zigzagged) so as not to lie side-by-side each other when they are viewed on a drawing.

Figure 5B:
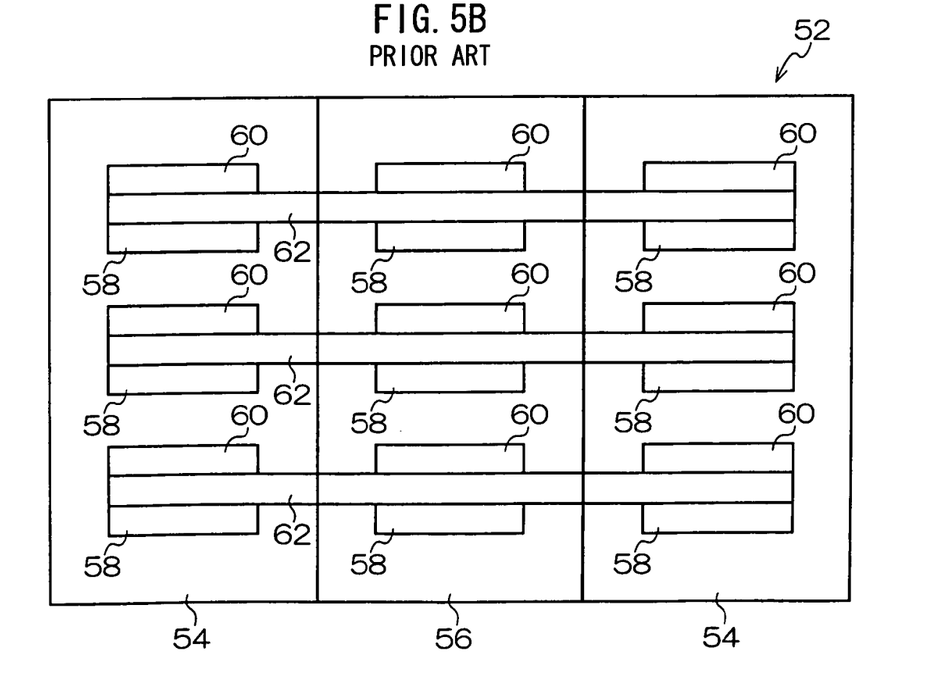
FIG. 5B is a plan view showing a semiconductor device according to prior art.

Thus, the layout size of the MOS semiconductor device 40 may be reduced, compared with a semiconductor device 52 including N-type MOS transistors 54 and P-type MOS transistors 56, each of which having a rectangular active region (an area defined by a source diffusion layer 58, a drain diffusion layer 60, and gate electrode 62 formed therebetween), as shown FIG. 5B, and thereby the MOS semiconductor device 40 may be miniaturized.

If octagonal active regions of identical conductive type, each of which includes plural transistors of identical conductive type, are used in the manner described above, the gate electrode commonly used by the plurality of transistors need not straddle (extend across) the regions of different conductive types. As shown in FIG. 5, however, in the CMOS configuration, wherein active regions of different conductive types lie side-by-side each other, the gate electrode inevitably straddles the regions of different conductive types, and thereby, to resolve this problem, it is necessary to fully work out the practical layout of the gate electrode.

In such a case, depending on the layout of the gate electrode, the problem to be resolved by the present invention may occur. This problem may be resolved by disposing the gate electrode 50 obliquely across the boundary between the N-type MOS transistor formation region 42 and the P-type MOS transistor formation region 44 in accordance with the present invention.

In this way, the effective gate width may be widened without widening the gate width of the gate electrode 50, and thereby abnormal resistance infrequently occurs in the gate electrode 50 even though the gate width of the gate electrode 50 is narrowed. Thus, the MOS semiconductor device 40 may be miniaturized.

As shown in FIG. 5A, according to the present invention, even though the active regions of the N-channel MOS transistor formation region 42 and of the P-type MOS transistor formation region 44 are not disposed in line each other, the problem of complexity may be avoided in determining the layout of the gate electrode.

For the MOS semiconductor device 40 with θ set to 45 degrees, assuming that θ is an angle, at which the gate electrode 50 is inclined relative to the boundary between the N-channel MOS transistor formation region 42 and the P-type MOS transistor formation region 44, the layout area thereof may be reduced by approximately 10% compared with the semiconductor device 52 as shown in FIG. 5B. For the MOS semiconductor device 40 with θ set to 60 degrees, the layout area thereof may be reduced by 20% compared with the semiconductor device 52 as shown in FIG. 5B.

In this example, the gate electrode width is reserved sufficiently to ensure the effective gate width, and thereby an increase in angle θ to any one of angles larger than 45 degrees further reduces the layout area.

It should be appreciated by the person skilled in the art that the semiconductor device of the present invention is not limited to those having the configurations described in the aforementioned embodiments and various types of alterations may be added thereto within the scope of the intent and effects of the present invention.

For example, in FIGS. 5A and 5B, the octagonal active regions, wherein the layout area has been further reduced, are illustrated. Alternatively, as shown in FIG. 5A, quadrangular active regions may be disposed to apply the gate electrode of the present invention. In such a case, although unlike the octagonal active regions, a high level of profound effects of reduction in layout area may not be achieved, the gate electrode of the present invention at least suppresses the enlargement of the layout area. Alternatively, in addition to the octagonal active regions as shown in FIGS. 5A and 5B, active regions shaped into any one of higher-ordered polygons than hexagon may be used.

It should be appreciated by the person skilled in the art that in FIG. 5A, the layout, in which the P-type region is disposed between two N-type regions, is illustrated but according to the present invention, the layout, in which the N-type region is disposed between two P-type regions, may be used, or the layout, in which the N-type regions and the P-type regions are disposed one after the other, may be used.

What is claimed is:

1. A semiconductor device comprising:
   a semiconductor substrate having an N-channel transistor formation region and a P-channel transistor formation region, the P-channel transistor formation region adjoining the N-channel transistor formation region at least at a surface of the semiconductor substrate, thereby forming a boundary defined by a contact between the N-channel transistor formation region and the P-channel transistor formation region on the surface of the semiconductor substrate; and
   a gate electrode disposed on the surface of the semiconductor substrate, the gate electrode straddling the N-channel transistor formation region and the P-channel transistor formation region, and being disposed obliquely across the boundary therebetween.

2. The semiconductor device according to claim 1, wherein the gate electrode is disposed across the boundary between the P-channel transistor formation region and the N-channel transistor formation region at an angle of 45 degrees.

3. The semiconductor device according to claim 2, wherein the gate electrode includes a metal silicide layer deposited on a conductive layer.

4. The semiconductor device according to claim 3, wherein the conductive layer of the gate electrode formed in the N-channel transistor formation region is an N-type conductive layer and the conductive layer of the gate electrode formed in the P-channel transistor formation region is a P-type conductive layer.

5. The semiconductor device according to claim 2, wherein the N-channel transistor formation region includes a plurality of first active regions and the P-channel transistor formation region includes a plurality of second active regions, each of the first active regions and each of the second active regions being displaced from each other.

6. The semiconductor device according to claim 1, wherein the gate electrode comprises a metal silicide layer deposited on a conductive layer.

7. The semiconductor device according to claim 6, wherein the conductive layer of the gate electrode formed in the N-channel transistor formation region is an N-type conductive layer and the conductive layer of the gate electrode formed in the P-channel transistor formation region is a P-type conductive layer.

8. The semiconductor device according to claim 7, wherein the conductive layers are made of the silicon layers.

9. The semiconductor device according to claim 7, wherein the N-channel transistor formation region includes a plurality of first active regions and the P-channel transistor formation region includes a plurality of second active regions, each of the first active regions and each of the second active regions being displaced from each other.

10. The semiconductor device according to claim 6, wherein the conductive layer is made of a silicon layer.

11. The semiconductor device according to claim 10, wherein the N-channel transistor formation region includes a plurality of first active regions and the P-channel transistor formation region includes a plurality of second active regions, each of the first active regions and each of the second active regions being displaced from each other.

12. The semiconductor device according to claim 6, wherein the N-channel transistor formation region includes a plurality of first active regions and the P-channel transistor formation region includes a plurality of second active regions, each of the first active regions and each of the second active regions being displaced from each other.

13. The semiconductor device according to claim 1, wherein the N-channel transistor formation region comprises a plurality of first active regions and the P-channel transistor formation region comprises a plurality of second active regions, each of the first active regions and each of the second active regions being displaced from each other.

* * * * *